United States Patent [19]
Chakradhar et al.

[11] Patent Number: 5,502,646
[45] Date of Patent: Mar. 26, 1996

[54] SELECTION OF PARTIAL SCAN FLIP-FLOPS TO BREAK FEEDBACK CYCLES

[75] Inventors: Srimat T. Chakradhar, No. Brunswick; Arunkumar Balakrishnan, Piscataway, both of N.J.

[73] Assignee: NEC USA, Inc., Princeton, N.J.

[21] Appl. No.: 161,140

[22] Filed: Dec. 2, 1993

[51] Int. Cl.$^6$ .................................................. G01I 31/28
[52] U.S. Cl. ............................................ 364/489; 371/22.3
[58] Field of Search .................................. 364/488, 489; 371/22.1, 22.3, 22.5, 22.6

[56] References Cited

U.S. PATENT DOCUMENTS

| | | | |
|---|---|---|---|
| 4,534,028 | 8/1985 | Trischler | 371/22.3 |
| 5,043,986 | 8/1991 | Agrawal et al. | 371/22.5 |
| 5,132,974 | 7/1992 | Rosales | 371/22.3 |
| 5,166,604 | 11/1994 | Ahanin et al. | 371/22.3 |
| 5,329,167 | 7/1994 | Farwell | 371/22.1 |
| 5,329,533 | 7/1994 | Lin | 371/22.3 |

OTHER PUBLICATIONS

Cheng et al, "A Partial Scan Method for Sequential Circuits with Feedback", IEEE Transactions on Computing, vol. 39, pp. 544–548 Aug. 1990.

Smith et al, "The Identification of Minimum Feedback Vertex set of a set of a Directed Graph," IEEE Transaction on Circuits and Systems, vol. 22, pp. 9–14, Jan. 1975.

Lee et al, "On Determining Scan Flip–Flops in Partial–Scan Designs", Proc. of Int'l Conf. on CAD, pp. 322–325, Nov. 1990.

S. Bhawmik et al, "A Partial San and Test Generation System", in Custom Integrated Circuits Conf., pp. 17.3.1 to 17.3.4, 1991.

V. Chickermane et al, "A Fault Oriented Partial Scan Design Approach", in Proc. In'tl Conf. on CAD, pp. 400–403, Nov. 1991.

*Primary Examiner*—Vincent N. Trans
*Attorney, Agent, or Firm*—Philip J. Feig

[57] ABSTRACT

In partial scan testing of a circuit the optimal quantity of scan flip-flops required to eliminate all feedback, except self-loops, in a circuit is determined. For determining a minimal feedback vertex set (MFVS) for the S-graph of a circuit to be tested, MFVS-preserving transformations, partitioned search strategy and integer linear program (ILP)-based lower bounding techniques are combined to obtain an exact algorithm for computing the MFVS. The result is used in the fabrication of the circuit with minimal overhead in terms of area and performance degradation as a result of providing the capability to perform partial scan testing of the fabricated circuit.

14 Claims, 5 Drawing Sheets

SELECTION OF PARTIAL SCAN FLIP-FLOPS TO BREAK FEEDBACK CYCLES

FIELD OF INVENTION

The present invention relates to partial scan testing and specifically to a method of selecting the optimal quantity of scan flip-flops required to eliminate all feedback in a circuit. Quite specifically, the invention concerns an exact algorithm for finding the minimum feedback vertex set of a directed graph in order to select partial scan flip-flops in a circuit.

BACKGROUND OF THE INVENTION

Scan design is a widely used design for testability technique. According to this technique, memory elements (flip-flops) are connected into a shift register scan chain during the test mode and hence, can be directly controlled and observed. When all of the flip-flops in a circuit are included in the scan chain (full scan design), combinational test generation methods are sufficient. However, full scan design may entail unacceptable penalties in terms of area overhead and performance degradation. An alternative is to select a subset of the flip-flops for inclusion in the scan chain (partial scan). Thus, both area and performance penalties can be significantly reduced, but the partial scan circuit requires the use of sequential test generation methods.

Various approaches for selecting the flip-flops used for partial scan are classified as testability analysis based, test generation based and structural analysis based. Cheng and Agrawal in an article entitled "A Partial Scan Method for Sequential Circuits with Feedback" in IEEE Transactions on Computing, vol 39, pages 544 to 548, August 1990, disclosed that the feedback cycles among flip-flops are mainly responsible for test generation complexity. They empirically observed that partial scan circuits with self-loops but without feedback cycles are easier to test than circuits that have long feedback cycles. A self-loop refers to a situation where the output of a flip-flop, after passing through combinational logic, feeds back as an input into the same flip-flop. Allowing self-loops in the partial scan circuit is particularly attractive since a large number of flip-flops in commercially used designs have self-loops. Therefore, the scan overhead will be high if it were deemed necessary to break all feedback loops.

The approach proposed by Cheng and Agrawal translates to a graph problem. Let $V_1, \ldots, V_n$ be the set of flip-flops in the circuit. The structural dependencies among flip-flops can be represented by a directed graph, called the S-graph. This graph has as many vertices as the number of flip-flops in the circuit. There exists an arc from vertex $v_i$ to vertex $v_j$ if there is a combinational path from flip-flop $v_i$ to flip-flop $v_j$. Also, there is an arc from vertex $v_i$ to itself (self-loop) if there is a combinational path from flip-flop $v_i$ to itself. The flip-flop selection problem is equivalent to the problem of finding the smallest set of vertices whose removal makes the S-graph acyclic. This is referred to as the minimum feedback vertex set (MFVS) problem. If self-loops are permitted in the partial scan circuit, then the self-loops in the S-graph may be disregarded when computing the MFVS. There are situations where it may be desirable to also eliminate self-loops. Since the vertices with self-loops must belong to the MFVS, these vertices can be deleted first from the S-graph. The remaining S-graph is smaller and its MFVS, which can be solved in accordance with the teachings of the present invention, is an easier problem to solve.

The MFVS problem belongs to the class of NP-hard problems. Algorithms to solve this problem were proposed even before complexity theoretic notions were developed. A known non-trivial exact algorithm is described in an article by Smith and Walford entitled "The Identification of Minimum Feedback Vertex set of a Directed Graph" in IEEE Transaction on Circuits and Systems, vol 22, pages 9 to 14, January 1975. Their method is practical only for small graphs. Several heuristic methods have been developed for large problems but these methods cannot ascertain the closeness of the solution to the optimal solution. It is possible that the problem of finding a solution that is provably within a constant factor of the optimal solution might be NP-hard.

SUMMARY OF THE INVENTION

The present invention is directed to an exact algorithm for finding the MFVS of a directed graph for use in testing circuits. Moreover, the invention uses less or comparable computing resources than the available heuristic methods. An MFVS-preserving graph transformation is developed defining a new class of graphs for which the MFVS problem can be solved in polynomial time complexity. Then, a partitioning scheme in a branch and bound procedure is described for providing an exact algorithm. The result is essentially a new branching strategy. Finally, a novel integer linear programming formulation for the MFVS problem is described. Such a formulation can be used directly to solve the MFVS problem or to find lower bounds on the cardinality of the MFVS. These lower bounds are useful in pruning the branch and bound search tree. The final objective of the invention is to solve the MFVS problem in order to provide an optimal selection of flip-flops contained in a circuit in order to perform a partial scan test of the circuit.

These and other objects of the invention will become more clearly apparent when the following description is read in conjunction with the accompanying drawings.

DETAILED DESCRIPTION

In order to provide a clearer understanding of the present invention, some definitions are required. Consider the S-graph of a sequential circuit. V and A are the vertex and arc sets, respectively. Also, n=|V| and m=|A|. For any arc $(v_i \rightarrow v_j)$, $v_i$ is a predecessor of $v_j$ and $v_j$ is a successor of $v_i$.

Let remove($v_i$) denote the process of removing the vertex $v_i$ along with its incoming and outgoing arcs. Let ignore($v_i$) denote the following process: connect all predecessors of $v_i$ to all its successors followed by remove($v_i$). Further, collapse all multiple arcs between a pair of vertices into a single arc. The following three transformations are known to be MFVS-preserving:

T1. If $v_i$ has a self-loop then remove($v_i$) and return $v_i$. The MFVS of the S-graph is obtained by adding $v_i$ to the MFVS of the modified graph.

T2. If $v_i$ has either indegree or outdegree equal to 0 then remove($v_i$). The MFVS of the S-graph and the modified graph are identical.

T3. If $v_i$ has either indegree or outdegree equal to 1 but no self-loop then ignore($v_i$). Any MFVS of the modified graph is a MFVS for the S-graph.

Each of the above transformations yields a modified graph with one less vertex. Starting from the S-graph, the transformations T1, T2 and T3 are repeatedly applied until no more transformations are applicable. The final graph obtained is unique irrespective of the order in which the transformations were applied. Hence, the process of repeatedly applying the transformations T1, T2 and T3 is well defined and the process is referred to as procedure compress_graph. This procedure can be implemented to run in $O(m \log n)$ time. The vertices returned by transformation T1 must be added to the MFVS of the final graph to obtain the MFVS of the given S-graph. In particular, if compress_graph reduces the S-graph to an empty graph then the MFVS is determined in polynomial time complexity. The class of graphs that reduce to an empty graph is called the two-way reducible class.

The present invention involves a MFVS-preserving transformation that can reduce S-graphs beyond that which is possible using compress_graph. There are two advantages of using the new transformation. First, since the transformation defines a new polynomial time solvable class of graphs that is strictly larger than the two-way reducible class, it is possible to determine the MFVS for some S-graphs which are not two-way reducible in polynomial time. Second, for arbitrary S-graphs, this new transformation will often result in a final graph with fewer vertices than the final graph obtained through compress_graph. Therefore, fewer vertices have to be considered in the search phase of the MFVS problem.

Figure 1:
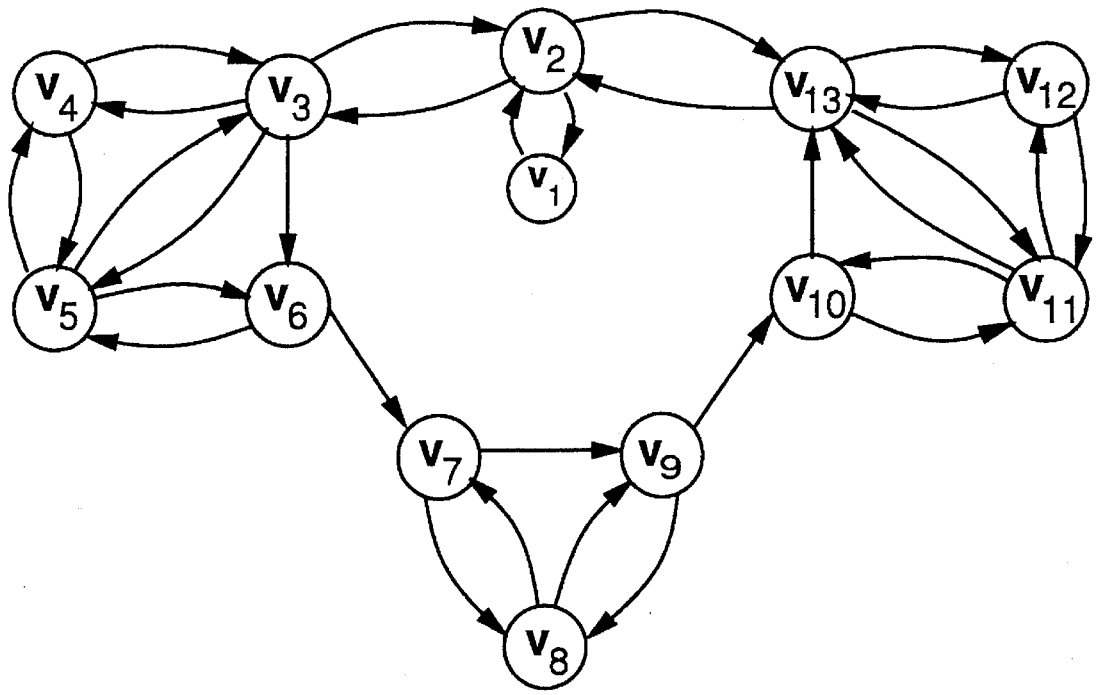
FIG. 1 is an S-graph of an arbitrary circuit.
Figure 2:
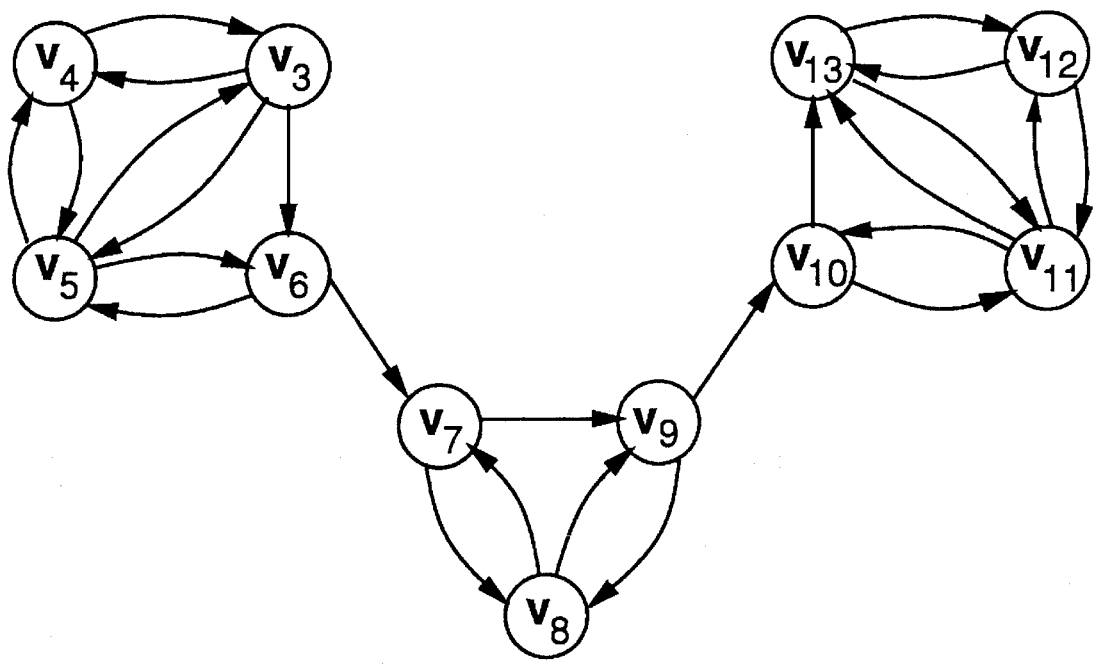
FIG. 2 is an S-graph of the S-graph in FIG. 1 reduced by the procedure compress_graph(s)
Figure 3:
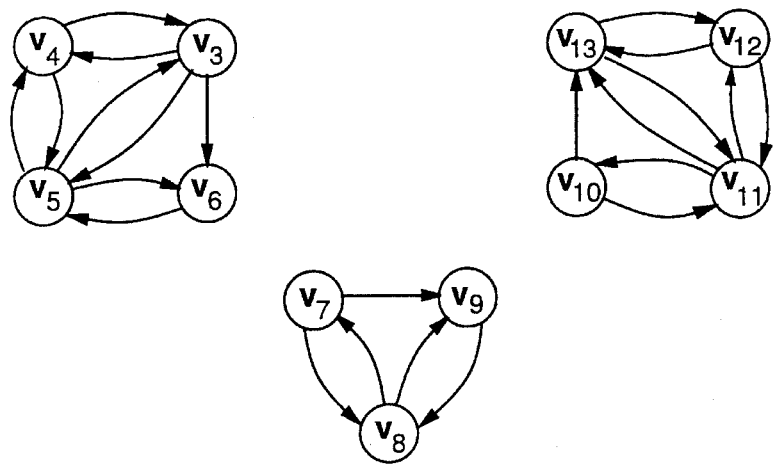
FIG. 3 is an S-graph of the SCC's of the S-graph in FIG. 2.
Figure 4:
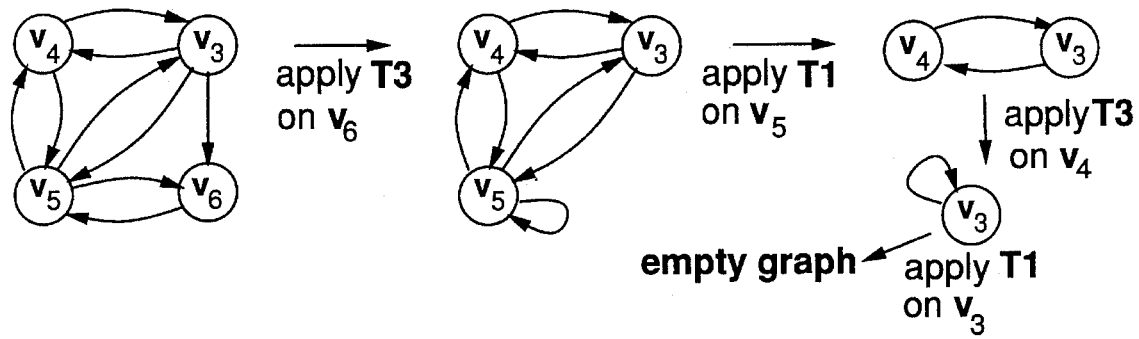
FIG. 4 illustrates the sequence of transformation to reduce the SCC $\{V_3, V_4, V_5, V_6\}$ in FIG. 3.

Consider the graph S shown in FIG. 1. Suppose this is the S-graph of a sequential circuit with thirteen flip-flops $X_1, \ldots X_{13}$. First, reduce the S-graph by using procedure compress_graph(S). Vertex $v_1$ is removed by transformation T3. This results in a self-loop on $v_2$. Vertex $v_2$ is then removed using transformation T1. No other transformations are applicable at this point. The transformed graph S' is shown in FIG. 2. Since S' is not empty, S does not belong to the two-way reducible class. However, the transformed graph S' can be further reduced based on the observation that it is sufficient to consider only the strongly connected components (scc's) of the graph S' for finding the MFVS. The graph S' has the following strongly connected components: $\{v_3, v_4, v_5, v_6\}$, $\{v_7, v_8, v_9\}$ and $\{v_{10}, v_{11}, v_{12}, v_{13}\}$. The scc's are extracted by deleting arcs $v_i \rightarrow v_j$, where $v_i$ and $v_j$ belong to different strongly connected components. The resulting graph S'' is shown in FIG. 3. It is still possible to reduce the graph S'' to the empty graph by again using the procedure compress_graph(S''). For example, consider the strongly connected component $\{v_3, v_4, v_5, v_6\}$ of S''. The sequence of transformations for this component is shown in FIG. 4. Transformation T3 is applied on vertex $v_6$ thereby eliminating vertex $v_6$. Then, transformation T1 is applied on vertex $v_5$ which results in the elimination of vertex $v_5$. Transformation T3 is applied on vertex $v_4$ leaving only self-loop vertex $v_3$. Transformation T1 is applied on vertex $v_3$ resulting in an empty graph. In a similar way, the other two scc's can also be reduced to empty graphs.

The following procedure reduces a graph by repeated use of the above observation:

```
Procedure transform_graph(S)
do {
    extract_scc(S),
    compress_graph(S);
    add vertices returned by compress_graph(S) to mfvs_list
}
} while (S is modified and S is not empty)
return(S and mfvs_list);
```

The transform_graph procedure is best understood by considering the graph S in FIG. 1. The procedure extract_scc computes the strongly connected components of a graph and deletes arcs $v_i \rightarrow v_j$ where $v_i$ and $v_j$ belong to different scc's. In this case, since S is strongly connected, procedure extract_scc(S) does not modify S. Upon applying the procedure compress_graph(S), the graph S is modified into the graph shown in FIG. 2. Since the procedure compress_graph modifies the graph S, recompute the strongly connected components of the modified graph using extract_scc(S). Now procedure extract_scc further modifies S into the graph shown in FIG. 3. Finally, compress_graph(S) reduces the graph shown in FIG. 4 to the empty graph. The transform_graph procedure can be implemented to run in time complexity $O(mn \log n)$.

This procedure transforms the graph S, which did not belong to the two-way reducible class, into the empty graph by using the procedure transform_graph. Consequently this defines a new class of graphs, strictly larger than the two-way reducible class. This class is referred to as scc compressible. That is, a graph S belongs to the class scc-compressible if and only if it can be reduced to an empty graph by the procedure transform_graph.

Figure 5:
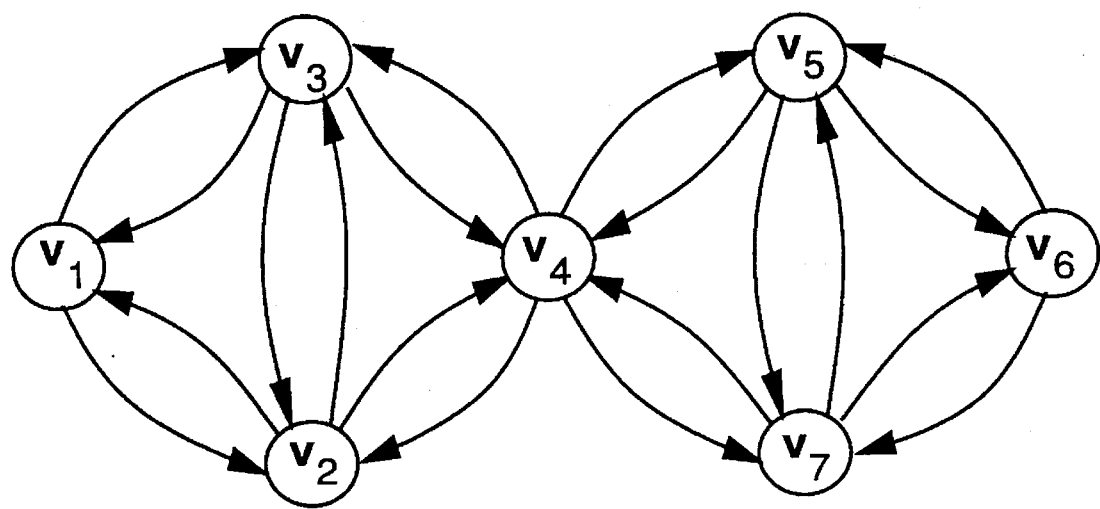
FIG. 5 is a strongly connected component (SCC) S-graph.
Figure 6:
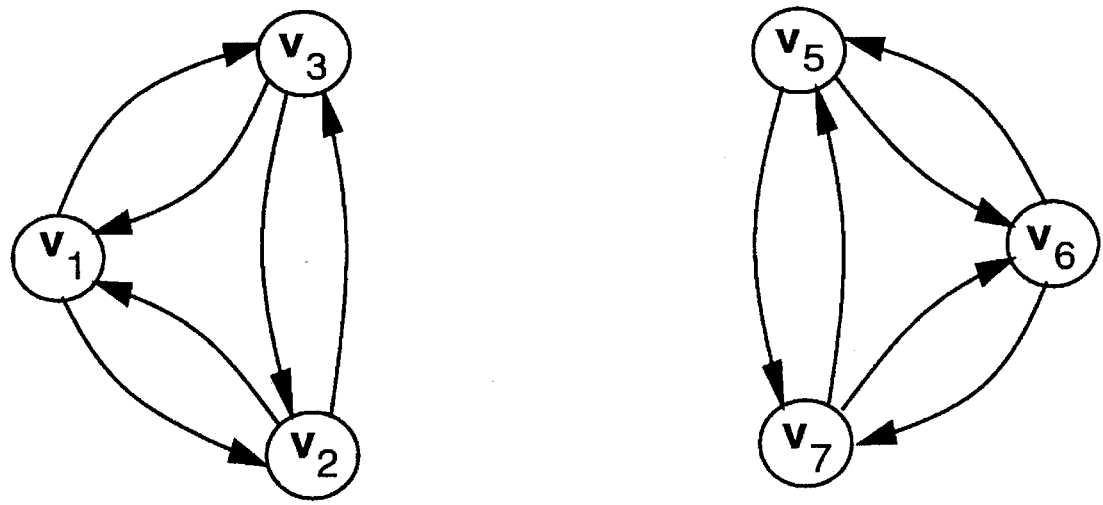
FIG. 6 is a modified S-graph of the graph shown in FIG. 5.
Figure 7:
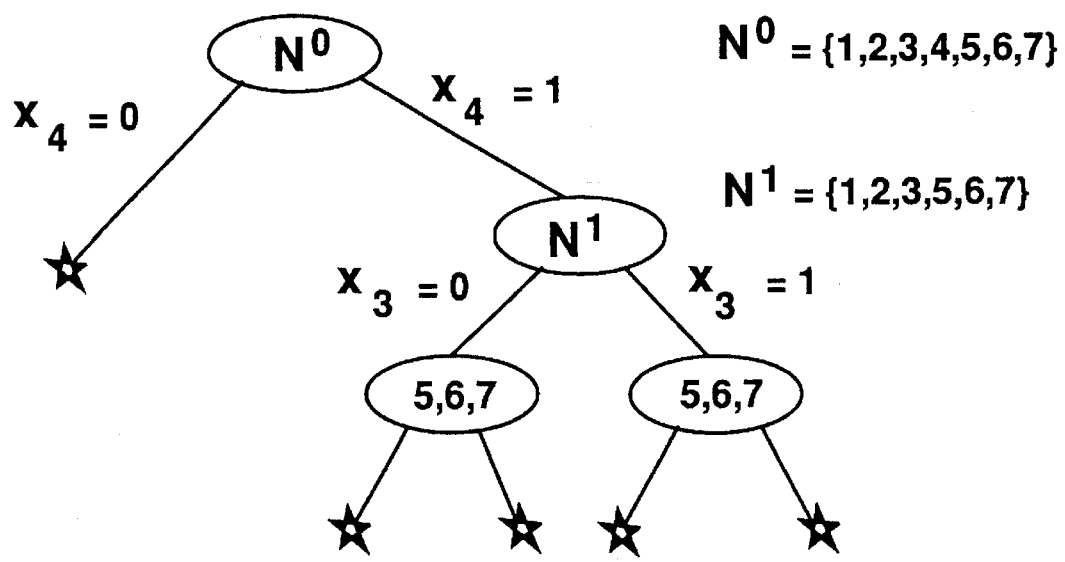
FIG. 7 is a representation of a conventional branch and bound of the search space corresponding to the S-graph in FIG. 6.
Figure 8:
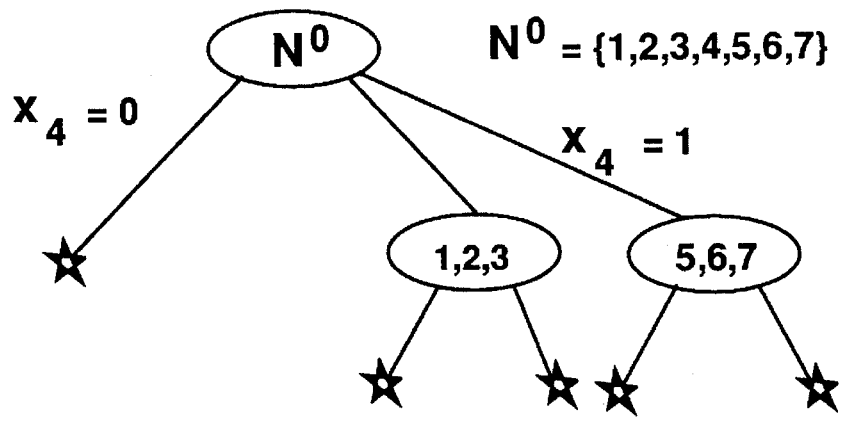
FIG. 8 is a representation of a partitioned branch and bound for the search space corresponding to the S-graph in FIG. 6.

The partitioning scheme used in the novel branch and bound procedure portion of the present invention is shown by the graph S-graph shown in FIG. 5. This graph has seven vertices labeled $v_1, \ldots, v_7$. The entire graph is a strongly connected component. Performing transform_graph(S) does not reduce the graph any further. A strongly connected component that cannot be further reduced by transform_graph is called a compressed sec. A Boolean variable $x_i$ is associated with each vertex $v_i$. For any assignment of 0–1 values to the Boolean variables, it is possible to construct a vertex set that includes only those vertices for which the corresponding Boolean variables assume the value 1. The 0–1 assignments that correspond to feedback vertex sets are feasible solutions. One or more of the feasible solutions could be the MFVS. The search commences with all Boolean variables unassigned. An index set is defined to be the list of subscripts of the unassigned variables. The index set corresponding to the initial search space is denoted as $N^0 = \{1, 2, 3, 4, 5, 6, 7\}$. Select $x_4$ as the first decision variable and let $x_4 = 1$. Therefore, vertex $v_4$ is included in the MFVS and is removed from S. The modified graph S' is shown in FIG. 6. Before selecting the next decision variable, try to reduce the graph S' by performing transform_graph(S'). In this case, the graph S' does not reduce any further. The index set corresponding to the search space of S' is $N^1 = \{1, 2, 3, 5, 6, 7\}$. Conventionally, one would proceed to explore this search space as shown in FIG. 7. However, the MFVS of S' can be found by solving the two strongly connected components $\{v_1, v_2, v_3\}$ and $\{v_5, v_6, v_7\}$, independently. Hence, the index set $N^1$ is partitioned into $\{1, 2, 3\}$ and $\{5, 6, 7\}$ and the corresponding subspaces are independently explored. This situation is shown in FIG. 8. The partitioning of the index set is the key to an efficient search for this problem. The number of nodes in the search tree of FIG. 8 is 3 whereas the number of nodes in the search tree of FIG. 7 is 4. In general, the search tree for the partitioned branch and bound will be much smaller than the search tree for the conventional branch and bound. The observation that it is sufficient to consider only the scc's of the graph for finding the MFVS is applied recursively within the branch and bound.

Any branch and bound procedure can be expressed as a sequence of moves through search spaces. Let $S(N^0)$ denote the initial space of (boolean) vectors and $S(N^i)$ for $i \geq 1$ denote the subsequent subspaces where $N^0$ and $N^i$ are the index sets. In conventional branch and bound search, the search space is halved by fixing the value of one decision variable. Therefore, $|N^{i+1}|=|N^i|-1$. For example, $|N^1|=|N^0|-1$ in FIG. 7. Sometimes, it is possible to have $|N^{i+1}|=|N^i|-k$ for some small value of k. This can happen if fixing one variable implicates other variables. A variable $x_i$ implicates a variable $x_j$ if inclusion or exclusion of $v_i$ from the MFVS forces the inclusion or exclusion of $v_j$ from the MFVS. The complexity of exploring a subspace is exponential in the size of its index set and so, every unit increase in the value of k reduces the subsequent search space by a factor of two.

In the partitioned search strategy, the index set of the current subspace is partitioned into one or more portions which are then solved independently. This results in the reduction of the subsequent search space by a large factor. For example, the size of the search space corresponding to the index set $N^1$ in the conventional branch and bound is $2^6=64$ whereas it is $2^3+2^3=16$ in the partitioned branch and bound. Hence, the search is likely to be much faster.

The partitions are inherent in the case of $N^1$. They depend on the compressed sccs present in the current graph. Since the search could branch multiway after each decision depending on the number of compressed scc's, this is referred to as the multiway branch and bound algorithm. The pseudo-code and other details involved in the implementation of this algorithm are described below.

For any compressed scc S, the size of MFVS is $\geq 2$. This value can be used as the trivial lower bound in the branch and bound procedure. The MFVS problem is formulated as a novel integer linear program (ILP). This formulation can be used in several ways for computing lower bounds.

In order to formulate the integer linear program, let $W=(w_1, w_2, \ldots, w_n)$ be real valued weights assigned to vertices of the graph S. Start with the following requirement: for every arc $v_i \rightarrow v_j$ it is required that $w_i > w_j$. By transitivity, this implies that the weights assigned to the vertices along any path must decrease. Clearly, the above requirement cannot be satisfied if the graph has cycles. This infeasibility is used to identify the vertex/arc feedback sets of the graph. A slack variable $y_i$ is introduced for each vertex $v_i$ and its value is used to satisfy the above requirement. That is, $$w_i - w_j + y_i > 0 \; \forall (v_i \rightarrow v_j) \in A$$

$w_i$ is free and $y_i \geq 0 \; \forall \; v_i \in V$

It is desirable to find a solution that minimizes the number of slack variables used. For this, multiply each slack variable by $x_i$, where $x_i$ is Boolean and then try to minimize $\Sigma x_i$. To refine this formulation further, bound the set of feasible solutions to the above constraints. Any feasible solution to W can be mapped into the range [0, n−1] such that the ordering relationship is preserved. For example, assign the lowest value to 0, the second lowest to 1, etc. Next, we associate a buffer of value n to each vertex instead of the slack variable $y_i$. Since, $-(n-1) \leq (w_i - w_j) \leq (n-1)$ for all arcs, $y_i = n$ will suffice. The Boolean variables are retained as they are. Now minimize $\Sigma x_i$ subject to $w_i - w_j + n x_i \geq 1 \; \forall \; (v_i \rightarrow v_j) \in A$, where $0 \leq w_i \leq n-1$ and $x_i$ are Boolean.

Figure 9:
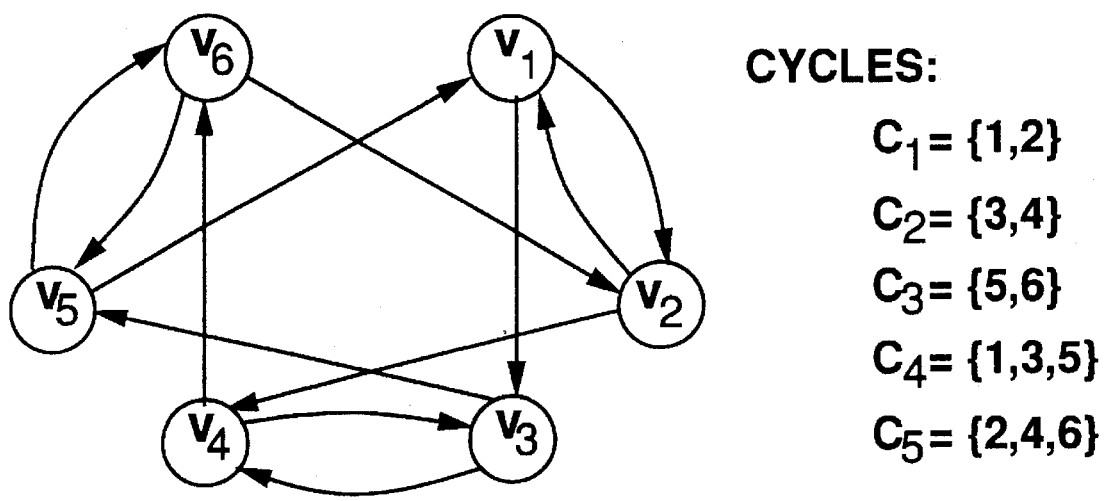
FIG. 9 is an S-graph to illustrate ILP formulation.

As an example, consider the graph shown in FIG. 9. This is an S-graph of a compressed scc. Let $W=(w_1, \ldots, w_6)$ and $X=(x_1, \ldots, x_6)$. The ILP formulation for this graph is as follows:

| Minimize | $x_1 + x_2 + x_3 + x_4 + x_5 + x_6$ |
|---|---|
| Subject to: | $w_1 - w_2 + nx_1 \geq 1$ |
| | $w_2 - w_1 + nx_2 \geq 1$ |
| | $w_1 - w_3 + nx_1 \geq 1$ |
| | $w_5 - w_1 + nx_5 \geq 1$ |
| | $w_2 - w_4 + nx_2 \geq 1$ |
| | $w_6 - w_2 + nx_6 \geq 1$ |
| | $w_3 - w_4 + nx_3 \geq 1$ |
| | $w_3 - w_5 + nx_3 \geq 1$ |
| | $w_4 - w_3 + nx_4 \geq 1$ |
| | $w_4 - w_6 + nx_4 \geq 1$ |
| | $w_5 - w_6 + nx_5 \geq 1$ |
| | $w_6 - w_5 + nx_6 \geq 1$ |
| | $0 \leq w_i \leq 5$ |
| | In the present example n = 6 |
| | $x_i$ are Boolean. |

An optimum solution to the ILP corresponds to an optimum solution of the MFVS problem. In the present example, the solution $X=(0, 1, 1, 0, 0, 1)$ corresponds to the MFVS $\{v_2, v_3, v_6\}$. Observe that the graph has many MFVS.

There exists a one-to-one correspondence between the feedback vertex sets and the feasible solutions to X of the above formulation.

The optimum solution to the above formulation gives the MFVS.

The linear programming relaxation to this formulation is one way to determine lower bounds. The lower bounds returned by relaxation are weak. In the relaxation, allow $0 \leq x_i \leq 1$ and hence $x_i = 1/n \; \forall \; i$ is feasible. Therefore, the optimum value returned by the LP is always $\leq 1$. This is especially weak considering that a lower bound of 2 for compressed scc's has been noted above.

It is possible to enhance the above formulation by adding more constraints. These could be facets derived from the graph or cuts derived from the above formulation. The LP relaxation after such enhancements will yield better bounds. One such constraint is the cycle constraint. For any cycle C, it is possible to add the inequality $\Sigma_{v_i \in C} x_i \geq 1$. Since two-cycles are easy to identify, one can add all two-cycle constraints and use the LP relaxation to compute lower bounds. If cycles with more than two vertices are included, better lower bounds are obtainable. Consider the example shown in FIG. 9. Add the following inequalities for the two cycles $C_1$, $C_2$ and $C_3$:

$w_1 + w_2 \geq 1$ $w_3 + w_4 \geq 1$ $w_5 + w_6 \geq 1$

The optimal solution to the LP relaxation after adding these constraints is 3 whereas it was 1 before.

The described MFVS-preserving transformation, partitioned search strategy and ILP-based lower bounding technique are combined to obtain an exact algorithm for computing the MFVS. Given an S-graph, it is first reduced by using the procedure transform_graph. If the resulting graph is not empty, then solve each compressed scc of this graph independently by using the partitioned search strategy. The following procedure computes the MFVS of an S-graph:

```
Procedure MFVS(S)
mfvs_list = transform_graph(S);
if (S is not empty) {
    for (each scc S_i) {
        SOLVE_SCC(S_i);
        add vertices returned by SOLVE_SCC(S_i) to mfvs_list;
    }
}
return(mfvs_list);
```

The optimum solution for each scc $S_i$ is obtained by using the recursive procedure SOLVE_SCC. Let $x_j$ be the first decision variable for scc $S_1$. The right branch for decision variable $x_j$ corresponds to the case in which vertex $v_j$ is included in the feedback vertex set. The left branch corresponds to the case in which vertex $v_j$ is excluded from the feedback vertex set. Compute the best possible feedback vertex set for both the right and left branches and store them in $r\_fvs[v_j]$ and $l\_fvs[v_j]$, respectively. The MFVS of the scc $S_1$ is equal to the minimum of $|r\_fvs[v_j]|$ and $|l\_fvs[v_j]|$.

The vertex $v_j$ can be included in the feedback vertex set by using procedure remove($v_j$). Similarly, vertex $v_j$ can be excluded from the feedback vertex set by using the procedure ignore($v_j$). In either case, the scc $S_1$ has changed and the procedure transform_graph($S_1$) is used to further reduce $S_1$. After including $v_j$, if the reduced $S_1$ has strongly connected components, then procedure SOLVE_SCC is recursively applied to each of these components. Then, restore (backtrack) $S_1$ to the state it was before the removal of vertex $v_j$. Next, investigate the left branch. After excluding $v_j$, we can use lower_bound($v_j$) to compute a lower bound on the cardinality of the MFVS for the transformed graph. If $|l\_fvs[v_j]|+\text{lower\_bound}(v_j) \geq |r\_fvs[v_j]|$, then there is no need to explore the left branch. Otherwise, again recursively compute the MFVS for each scc in the reduced $S_1$. Then, restore (backtrack) $S_1$ to the state it was before ignoring vertex $v_j$. For the lower bound computation use either the trivial lower bound of 2 or the lower bound returned by the enhanced LP relaxation described above.

```
Procedure SOLVE_SCC(S_i)
Pick a variable v from scc S_i;
r_fvs[v] = φ; l_fvs[v] = φ;
remove(v);/* Include v in feedback vertex set */
r_fvs[v] = transform_graph(S_i) + v;
if (S_i is not empty) {
    for (each scc of S_i)
        r_fvs[v] = r_fvs[v] + SOLVE_SCC(scc),
}
backtrack;/* Restore S_i to its state before remove(v) */
ignore(v);/* Exclude v from feedback vertex set */
l_fvs[v] = transform_graph(S_i);
if (|l_fvs[v]| + lower_bound(v) < |r_fvs[v]|){
    if (S_i is not empty) {
        for (each scc of S_i)
            l_fvs[v] = l_fvs[v] + SOLVE_SCC(scc);
    }
    backtrack; /* Restore S_i to its state before ignore(v) */
    return( minimum (r_fvs[v],l_fvs[v]));
} else {
    backtrack; /* Restore S_i to its state before ignore(v) */
    return(r_fvs[v]);
}
```

The procedure MFVS presented above was implemented in C language. The algorithm comprising the present invention (PSCAN) was compared with three other state-of-the art methods: (1) Lee and Reddy as described in an article entitled "On Determining Scan Flip-Flops in Partial-Scan Designs", in Proc. of the Int'l Conf. on CAD, pp. 322–325, November 1990, (2) Pascant as described in an article by S. Bhawmik et al entitled "Pascant: A Partial Scan and Test Generation System" in Custom Integrated Circuits Conf, pp. 17.3.1 to 17.3.4, 1991, and (3) Opus as described in an article by V. Chickermane et al entitled "A Fault Oriented Partial Scan Design Approach" in Proc. Int'l Conf on CAD, pp. 400–403, November 1991. All three methods are heuristic approaches and do not guarantee an MFVS. However, they each select flip-flops to break all cycles (except self-loops) in the S-graph. All experiments were performed on a Sparc2 SUN workstation.

Table 1 reports experimental results on the ISCAS 89 benchmark set of circuits. The number of primary inputs, primary outputs and flip-flops in a circuit are shown under columns PI, PO and FF, respectively. The number of scan flip-flops and the CPU seconds required to select the flip-flops by the different methods are shown in columns Scan Flip-Flops and CPU sec, respectively. The reported CPU time does not include the time required to generate the S-graph. Under columns LR, Pasc, Opus and PSCAN, are data obtained by using the Lee and Reddy algorithm, Pascant, Opus and the present invention exact algorithm, respectively. Lee and Reddy have proposed two different heuristics. The results of the better of the two heuristics is shown. Results for the exact algorithm of Smith and Walford supra are not included here since their technique is practical only for small circuits.

Optimal results for large circuits was achieved for the first time using the present invention. PSCAN computes the MFVS of large S-graphs (obtained from circuits like s15850, s38417, s38584 and others) in less than one minute. The CPU time required by PSCAN to compute the optimal solution is comparable or better than the time required by the heuristic methods to compute an approximate solution. For small circuits, the feedback vertex sets produced by the heuristic methods are optimal. For the larger circuits, the heuristic methods produce suboptimal results. As an example, consider the circuit s38417. This circuit has 28 primary inputs, 106 primary outputs and 1636 flip-flops. Lee and Reddy's technique computed a feedback vertex set of size 384. Pascant and Opus computed feedback vertex sets of size 400 and 380, respectively. PSCAN computed the optimal feedback vertex set of size 374.

The algorithm of the present invention was also compared with the conventional branch and bound method. If the new transformation procedure and pruning techniques are not included, then the conventional branch and bound algorithm is unable to determine the MFVS for the S-graphs of large circuits like s15850 and s38417 even after running on a Sparc 2 SUN workstation for more than three days. If the new transformation and the pruning techniques are included, then the conventional branch and bound algorithm is able to determine the MFVS for all the S-graphs except for the S-graph of s38417. However, for the cases for which the MFVS is obtained, the branch and bound algorithm method requires significantly more CPU seconds. As shown in Table 1, by using partitioned branch and bound, PSCAN is able to compute the MFVS for the S-graphs of s15850 and s38417 in less than a minute of CPU time.

The '-' symbol in Table 1 indicates that the feedback vertex set reported by the corresponding program does not break all cycles.

If self-loops are also broken, then the size of the feedback vertex set obtained by the heuristic methods is the same as the optimal solution determined by PSCAN for all benchmark circuits. This is because these circuits have many self-loops and the graph obtained after deleting self-loop vertices is either already acyclic or has very few cycles. Therefore, the present invention provides superior results when applied to circuits having self-loops which are to remain unbroken during partial scan testing.

TABLE 1

Partial scan results.

| Circuit | PI | PO | FF | Scan Flip Flops | | | | CPU Sec. | | | |
|---|---|---|---|---|---|---|---|---|---|---|---|
| | | | | LR | Pasc | Opus | $P_{SCAN}$ | LR | Pasc | Opus | $P_{SCAN}$ |
| s208 | 11 | 2 | 8 | 0 | 0 | 0 | 0 | 0 | 0 | 0 | 0 |
| s298 | 3 | 6 | 14 | 1 | 1 | 1 | 1 | 0.1 | 0 | 0.1 | 0.1 |
| s344 | 9 | 11 | 15 | 5 | 5 | 5 | 5 | 0 | 0 | 0.1 | 0.1 |
| s349 | 9 | 11 | 15 | 5 | 5 | 5 | 5 | 0 | 0 | 0.1 | 0.1 |
| s382 | 3 | 6 | 21 | 9 | 9 | 9 | 9 | 0 | 0 | 0 | 0 |
| s386 | 7 | 7 | 6 | 5 | 5 | 5 | 5 | 0 | 0 | 0.1 | 0.1 |
| s400 | 3 | 6 | 21 | 9 | 9 | 9 | 9 | 0 | 0 | 0 | 0 |
| s420 | 19 | 2 | 16 | 0 | 0 | 0 | 0 | 0 | 0 | 0.4 | 0 |
| s444 | 3 | 6 | 21 | 9 | 9 | 9 | 9 | 0 | 0 | 0 | 0 |
| s510 | 19 | 7 | 6 | 5 | 5 | 5 | 5 | 0 | 0 | 0.1 | 0.1 |
| s526 | 3 | 6 | 21 | 3 | 4 | 3 | 3 | 0 | 0 | 0 | 0 |
| s526n | 3 | 6 | 21 | 3 | 4 | 3 | 3 | 0 | 0 | 0 | 0 |
| s641 | 35 | 24 | 19 | 7 | 7 | 7 | 7 | 0 | 0 | 0.3 | 0.1 |
| s713 | 35 | 23 | 19 | 7 | 7 | 7 | 7 | 0 | 0 | 0.3 | 0.1 |
| s820 | 18 | 19 | 5 | 4 | 4 | 4 | 4 | 0 | 0 | 0 | 0 |
| s832 | 18 | 19 | 5 | 4 | 4 | 4 | 4 | 0 | 0 | 0 | 0 |
| s838 | 35 | 2 | 32 | 0 | 0 | 0 | 0 | 0 | 0 | 0.4 | 0 |
| s953 | 16 | 23 | 29 | 5 | 5 | 5 | 5 | 0 | 0 | 0.1 | 0.1 |
| s1196 | 14 | 14 | 18 | 0 | 0 | 0 | 0 | 0 | 0 | 0.4 | 0 |
| s1238 | 14 | 14 | 18 | 0 | 0 | 0 | 0 | 0 | 0 | 0.4 | 0 |
| s1423 | 17 | 5 | 74 | 22 | 37 | 22 | 21 | 0.1 | 0.3 | 1.0 | 0.9 |
| s1488 | 8 | 19 | 6 | 5 | 5 | 5 | 5 | 0 | 0 | 0.5 | 0.1 |
| s1494 | 8 | 19 | 6 | 5 | 5 | 5 | 5 | 0 | 0 | 0.5 | 0.1 |
| s5378 | 35 | 49 | 179 | 30 | 32 | 30 | 30 | 0.1 | 0.2 | 0.3 | 0.1 |
| s9234 | 19 | 22 | 228 | 55 | 65 | — | 53 | 0.2 | 0.8 | 6.6 | 0.9 |
| s13207 | 31 | 121 | 669 | 59 | 71 | — | 59 | 0.4 | 1.5 | 24.2 | 0.4 |
| s15850 | 14 | 87 | 597 | 91 | 101 | 91 | 88 | 2.2 | 6.4 | 18.0 | 48.0 |
| s35932 | 35 | 320 | 1728 | — | 306 | 306 | 306 | 1.8 | 9.3 | 27.3 | 0.5 |
| s38417 | 28 | 106 | 1636 | 384 | 400 | 380 | 374 | 3.0 | 43.3 | 909.0 | 32.8 |
| s38584 | 12 | 278 | 1452 | 426 | 376 | 222 | 218 | 0 | 33.0 | 55.8 | 7.7 |

The present invention comprises an exact algorithm for computing the MFVS of the flip-flop dependency graph of a sequential circuit. While the algorithm has worst case exponential complexity, experimental results show that the method outperforms the available heuristic methods for large practical instances of the partial scan problem. The presented solution has other applications. For example, the proposed technique has been used to solve MFVS problems arising in the resynthesis and retiming of sequential circuits for enhanced testability.

The result of the exact algorithm, namely the finding of an optimal quantity of scan flip-flops required to eliminate all feedback, except self-loops, in a circuit is used in the fabrication of the circuit to provide the additional scan flip-flops required for the partial scan testing of the circuit, with minimal overhead costs in terms of area and performance degradation.

While there has been described and illustrated a preferred method of selecting the optimal quantity of scan flip-flops required to eliminate all feedback, except self-loops, in a circuit, it will be apparent to those skilled in the art that variations and modifications are possible without deviating from the broad principles and spirit of the present invention and shall be limited solely by the scope of the claims appended hereto.

What is claimed is:

1. A method of determining an optimal quantity of scan flip-flops required to eliminate feedback loops in a sequential logic circuit, comprising the steps of:

a) deriving an S-graph of the sequential logic circuit;

b) applying minimum feedback vertex set (MFVS) preserving transformations to the S-graph to reduce the S-graph to non-empty, compressed SCCs (strongly connected components);

c) performing a partitioned branch and bound method to solve the compressed SCCs of the graph;

d) applying integer linear programming (ILP) to obtain an optimal solution or lower bound for the MFVS of the S-graph, and e) if a lower bound is obtained in step (d), repeat steps (c) and (d) or f) if any optimal solution is obtained is step (d), incorporating the quantity of scan flip-flops obtained as the optimal solution into the sequential logic circuit for enabling partial scan testing of the sequential logic circuit.

2. A method as set forth in claim 1, wherein said applying MFVS preserving transformations comprises applying procedure transform__graph.

3. A method as set forth in claim 2, wherein said performing a partitioned branch and bound method comprises applying procedure SOLVE__SCC.

4. A sequential logic circuit including the quantity of flip-flops for performing partial scan testing as determined in accordance with the method of claim 3.

5. A method as set forth in claim 3 wherein said applying integer linear programming comprises:

minimizing $\Sigma x_i$, subject to $w_i - w_j + nx_i \geq 1 \; \forall \; (v_i \rightarrow v_j) \in A$, where $0 \leq w_i \leq n-1$ and $x_i$ are Boolean and where $w_i$ are real value weights assigned to vertices $v_i$ of the graph and for any arc $v_i \rightarrow v_j$, $w_i > w_j$.

6. A sequential logic circuit including the quantity of flip-flops for performing partial scan testing as determined in accordance with the method of claim 5.

7. A method as set forth in claim 5, whereby for any cycle C in a graph $\Sigma_{v_i \in c} x_i \geq 1$.

8. A sequential logic circuit including the quantity of flip-flops for performing partial scan testing as determined in accordance with the method of claim 7.

9. A method as set forth in claim 1, wherein said performing a partitioned branch and bound method comprises applying procedure SOLVE_SCC.

10. A sequential logic circuit including the quantity of flip-flops for performing partial scan testing as determined in accordance with the method of claim 1.

11. A method as set forth in claim 1 wherein said applying integer linear programming comprises:

minimizing $\Sigma x_i$, subject to $w_i - w_j + nx_i \geq 1 \; \forall \; (v_i \rightarrow v_j) \in A$, where $0 \leq w_i \leq n-1$ and $x_i$ are Boolean and where $w_i$ are real value weights assigned to vertices $v_i$ of the graph and for any arc $v_i \rightarrow v_j$, $w_i > w_j$.

12. A method as set forth in claim 11, whereby for any cycle C in a graph $\Sigma_{v_i \in c} x_i \geq 1$.

13. A method as set forth in claim 1, where said performing a partitioned branch and bound method is performed recursively.

14. A sequential logic circuit including the quantity of flip-flops for performing partial scan testing as determined in accordance with the method of claim 13.

* * * * *